US012672583B2

(12) United States Patent 
 Zhou

(10) Patent No.: US 12,672,583 B2 
(45) Date of Patent: Jun. 30, 2026

(54) LIGHT EMITTING DIODE STRUCTURE INCLUDING FRONT SIDE ELECTRODES CONNECTED TO METAL INTERCONNECTS AND METHOD OF MANUFACTURING THE SAME

(71) Applicant: UNITED MICROELECTRONICS CORP., Hsin-Chu City (TW)

(72) Inventor: Zhibiao Zhou, Singapore (SG)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 585 days.

(21) Appl. No.: 17/891,116

(22) Filed: Aug. 18, 2022

(65) Prior Publication Data 
 US 2024/0021593 A1 Jan. 18, 2024

(30) Foreign Application Priority Data

Jul. 12, 2022 (TW) .................................. 111126108

(51) Int. Cl.
| | |
|---|---|
| *H10W 90/00* | (2026.01) |
| *H10H 20/01* | (2025.01) |
| *H10H 20/857* | (2025.01) |
| *H10W 70/60* | (2026.01) |
| *H10W 90/22* | (2026.01) |

(52) U.S. Cl.
 CPC ............ *H10W 90/00* (2026.01); *H10H 20/01* (2025.01); *H10H 20/018* (2025.01); *H10H 20/857* (2025.01); *H10H 20/0364* (2025.01); *H10W 70/60* (2026.01); *H10W 90/22* (2026.01)

(58) Field of Classification Search
 CPC ........................... H01L 25/167; H10H 29/142 
 See application file for complete search history.

(56) References Cited

U.S. PATENT DOCUMENTS

| | | | |
|---|---|---|---|
| 8,476,169 | B2 | 7/2013 | Yang |
| 8,722,501 | B2 | 5/2014 | Tsai |
| 8,754,448 | B2 | 6/2014 | Liao |
| 8,796,695 | B2 | 8/2014 | Liao |
| 9,184,100 | B2 | 11/2015 | Tsai |
| 10,622,342 | B2 | 4/2020 | Liu |
| 10,985,271 | B2 | 4/2021 | Yang |
| 11,081,579 | B2 | 8/2021 | Chang |
| 11,239,327 | B2 | 2/2022 | Lee |
| 11,264,492 | B2 | 3/2022 | Huang |
| 11,296,214 | B2 | 4/2022 | Lee |

(Continued)

FOREIGN PATENT DOCUMENTS

| | | |
|---|---|---|
| CN | 114641816 A | 6/2022 |
| TW | 201943993 A | 11/2019 |
| TW | 202226525 A | 7/2022 |

*Primary Examiner* — William B Partridge 
*Assistant Examiner* — Mehek Ahmed 
(74) *Attorney, Agent, or Firm* — Winston Hsu

(57) ABSTRACT

A light-emitting diode (LED) structure is provided in the present invention, including a substrate, a dielectric layer on the substrate, metal interconnects in the dielectric layer, LED dies on the dielectric layer, wherein each LED die is provided with a front side and a back side, the back side is bonded with the dielectric layer, and the cathode and anode are on the front side of LED die, and bonding lines connecting the cathode and anode on the front side of LED die to the metal interconnects respectively.

7 Claims, 17 Drawing Sheets

(56)          References Cited

U.S. PATENT DOCUMENTS

| | | |
|---|---|---|
| 2017/0194302 A1 | 7/2017 | Disney |
| 2018/0211582 A1 | 7/2018 | Sakariya |
| 2020/0251638 A1 | 8/2020 | Morris |
| 2020/0395403 A1 | 12/2020 | Ahmed |
| 2022/0052240 A1* | 2/2022 | Jang ..................... H10H 29/142 |
| 2022/0139998 A1 | 5/2022 | Herner |
| 2022/0406981 A1* | 12/2022 | Yamazaki ............ H10H 20/857 |

* cited by examiner

LIGHT EMITTING DIODE STRUCTURE INCLUDING FRONT SIDE ELECTRODES CONNECTED TO METAL INTERCONNECTS AND METHOD OF MANUFACTURING THE SAME

BACKGROUND OF THE INVENTION

1. Field of the Invention

The present invention relates generally to a light emitting diode (LED) structure, and more specifically, to a Micro LED structure formed directly on a substrate of driver circuit and method of manufacturing the same.

2. Description of the Prior Art

Currently, light-emitting diode (LED) dies can already function as individual pixels in display through thin-film process, miniaturization process and array arrangement of LED devices. The application of LED device has changed from the backlight source used in traditional LCD to the pixel unit that actually constitutes the display image. For example, Micro LED is considered as a display technology in next generation, with its LED size (less than 100 μm) is $\frac{1}{100}$ of conventional LED device, to serve as individual, actively emitting pixel units. Micro LED is better than traditional LCD, Mini LED and even the OLED having same active emitting mechanism, no matter in the characteristics of contrast, power consumption, response time, etc. Overall, Micro LED display is thinner than LCD display, and in comparison to the OLED technology used in current mobile phone screen, it provides advantages like excellent luminous efficiency, high resolution, wide operating temperature, longer production cycle, etc., thus is considered as a display technology in next generation. Micro LED has quite prospects for development in product applications like wearable device, indoor display screen, head-mounted display, head-up display, tail lamp, VR/AR/MR, projector.

Nevertheless, there are still many technical obstacles to be overcome in Micro LED technology. For example, conventional Micro LED process needs mass transfer step to bond the completed, individual LED dies onto a substrate of driver circuit. However, the mass transfer technology at this stage has very low transfer efficiency, and its yield also needs to be improved. There is an urgent demand for those of skilled in the art to develop novel Micro LED process and structure, in hope of applying mature Micro LED technology in mass production, such as nowadays popular Metaverse theme or high-resolution, high-performance AR/VR/MR advanced products.

SUMMARY OF THE INVENTION

In the light of the aforementioned technical obstacles encountered in current Micro LED technology, the present invention hereby provides a novel light-emitting diode (LED) structure, with features that the LED structure is formed directly on a substrate of driver circuit without using mass transfer process, so as to obtain better yield and facilitate the soft repair for defected pixels. In addition, the pixel structures provided by the present invention are all surrounded completely by metal grids to further improve their luminous efficiency.

One aspect of present invention is to provide a light-emitting diode (LED) structure, including a substrate, a first dielectric layer on the substrate, metal interconnects in the first dielectric layer, multiple LED dies in the first dielectric layer, wherein each LED die is provided with a front surface and a back surface, the back surface is connected with the first dielectric layer, and a cathode and an anode of each LED die are on the front surface, and conductive lines connecting the cathode and the anode of LED die on the front surface respectively to the metal interconnects.

Another aspect of present invention is to a method of manufacturing a light-emitting diode (LED) structure, including steps of providing a substrate with a first dielectric layer thereon and metal interconnects in the first dielectric layer, providing a LED wafer with a handle wafer and LED chips on the handle wafer, bonding the LED wafer onto the first dielectric layer, removing the handle wafer, performing a photolithography process to pattern the LED chips into individual LED dies, wherein each LED die is provided with a cathode and an anode on surfaces of the LED die, and forming conductive lines connecting the cathode and the anode of each LED die respectively to the metal interconnects after the photolithography process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
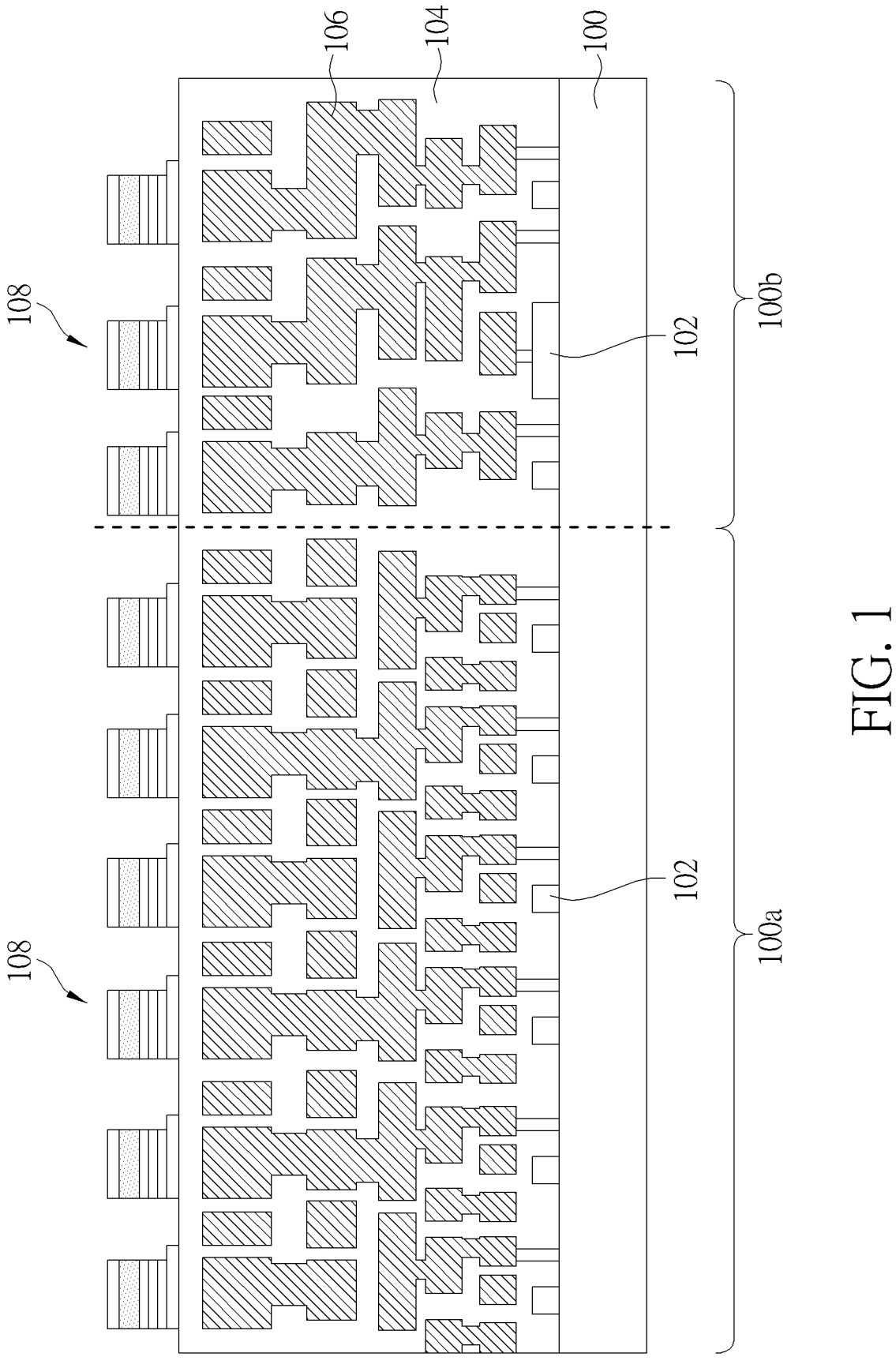
FIG. 1 is a schematic cross-section of a light-emitting diode (LED) structure in accordance with the preferred embodiment of the present invention.

Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

In addition, spatially relative terms, such as "beneath," "below," "lower," "above," "upper," and the like, may be used herein for ease of description to describe one element or feature's relationship to another element(s) or feature(s) as illustrated in the figures.

In general, terminology may be understood at least in part from usage in context. For example, the term. "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

The light-emitting diode (LED) structure of the present invention will now be described in following embodiments with reference to drawings. The LED structure of present invention is a kind of Micro LED structure, which is different from conventional liquid-crystal displays (LCDs, including Mini LED displays) using LED devices as a backlight source. Each LED device of the present invention functions as a self-luminous pixel unit, which may be formed together with driver circuit, logic circuit and memory circuit on a substrate in the same CMOS process.

Please refer to FIG. 1, which is a schematic cross-section of a LED structure in accordance with the preferred embodiment of the present invention. The LED structure of present invention includes a substrate 100 to serve as a basis for setting entire structure, such as a substrate made of semiconductor material suitable for CMOS process, wherein the semiconductor material may be selected from the group of silicon (Si), germanium (Ge), silicon germanium compound (SiGe), silicon carbide (SiC) and gallium arsenide (GaAs), etc. In the embodiment of present invention, the substrate 100 may be a substrate used in large-screen TVs or may be a substrate used in small-screen head-mounted display or smart glasses. In the embodiment of present invention, a memory region 100a and a logic region 100b are defined on the substrate 100, wherein devices 102 like static random access memory (SRAM) or Flash memory may be set in the memory region 100a on the substrate 100 to function as a cache or storage module required in soft repair action. Devices 103 like logic switch or LED driver may be set in the logic region 100b on the substrate to receive, transmit or process necessary image signal. Metal interconnects 106 manufactured by conventional CMOS BEOL (back end of line) process are further provided on the substrate 100, which are in a dielectric layer 104 and electrically connected with the devices 102, 103 or the substrate 100 below through contacts. The dielectric layer 104 may include common inter-layer dielectric (ILD) and inter-metal dielectric (IMD) on logic devices, with material like ultra low-k (ULK) dielectric or tetraethoxysilane (TEOS), formed on the substrate through CVD process. The material of metal interconnects 106 may be selected from a group of tungsten (W), copper (Cu), aluminum (Al), titanium aluminum alloy (TiAl) and cobalt tungsten phosphide (CoWP), but not limit thereto.

Refer still to FIG. 1. Multiple LED dies 108, such as blue LEDs or UV LEDs, are spaced apart from each other in an uniform arrangement on the dielectric layer 104. In the embodiment of present invention, the LED die 108 is a Micro LED, with its size less than 100 μm. In the application like mixed reality (MR) or smart glasses that requires transparent regions, the LED die 108 may be set only on specific regions, such as peripheral regions of the substrate 100. Please note that in the present invention, these LED dies 108 are not set on the dielectric layer 104 through conventional mass transfer method. Detailed process flow will be described in following embodiments.

Figure 2:
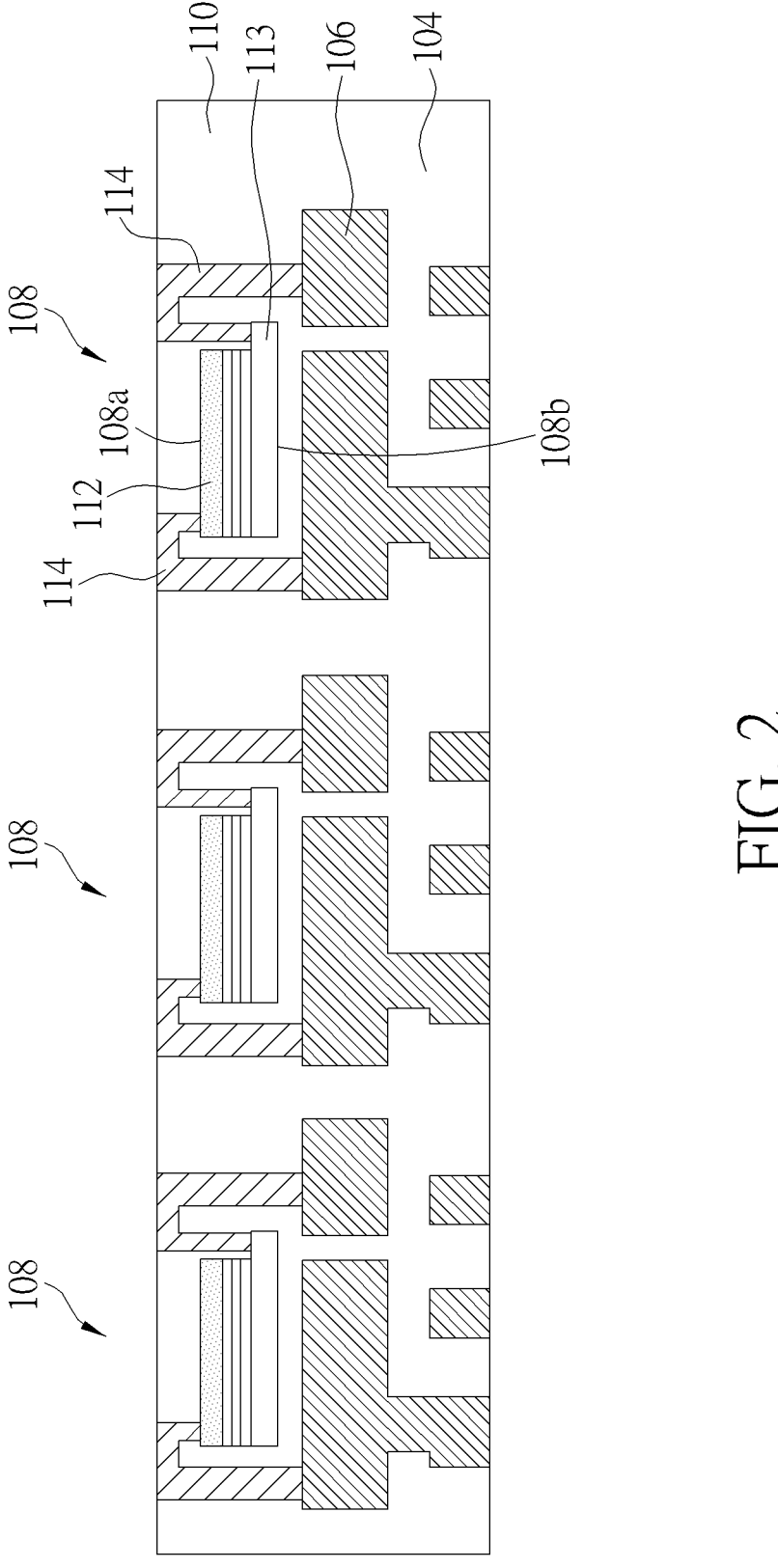
FIG. 2 is an enlarged cross-section of the LED structure in accordance with one embodiment of the present invention.

Please refer to FIG. 2, which is an enlarged cross-section of the LED structure in accordance with one embodiment of the present invention. In this embodiment, the LED dies 108 are set on the dielectric layer 104. Another dielectric layer 110 is further formed on the dielectric layer 104 to cover these LED dies 108. The anode 112 and cathode 113 of the LED die 108 are further electrically connected with the metal interconnects 106 below through the electrically conductive lines 114 formed in the dielectric layer 110. In this way, every LED die 108 is connected with the driver circuit below and be controlled and activated by the driver circuit. Please note that the LED die 108 of present invention is provided with a front surface 108a and a back surface 108b, wherein the LED die 108 is set with its back surface 108b contacting on the dielectric layer 104, while the conductive lines 114 are connected out from the anode 112 and cathode 113 on the front surface 108a. Furthermore, since the anode (top layer) 112 and the cathode (bottom layer) 113 of LED die 108 have to be connected out from the front side of the die through conductive lines 114 in the process, the cathode 113 in the bottom layer should extend in the horizontal direction beyond the anode 112 in the top layer (the positions of anode 112 and cathode 113 may be exchanged) to provide contact area on the front surface 108a. This feature is different from conventional approach of adopting mass transfer for setting the LED dies. The anode and cathode of LED die in conventional approach are usually flip-bonded directly with its bottom side contacting on the driver circuit. In the embodiment of present invention, the material of dielectric layer 110 may be the same as the one of dielectric layer 104, such as silicon oxide, ultra low-k (ULK) material or tetraethoxysilane (TEOS). The material of conductive line 114 may be tungsten (W), copper (Cu), aluminum (Al), silver (Ag), gold (Au), nickel (Ni), titanium (Ti) or indium tin oxide (ITO), etc., or multilayer structure formed thereof.

Figure 3:
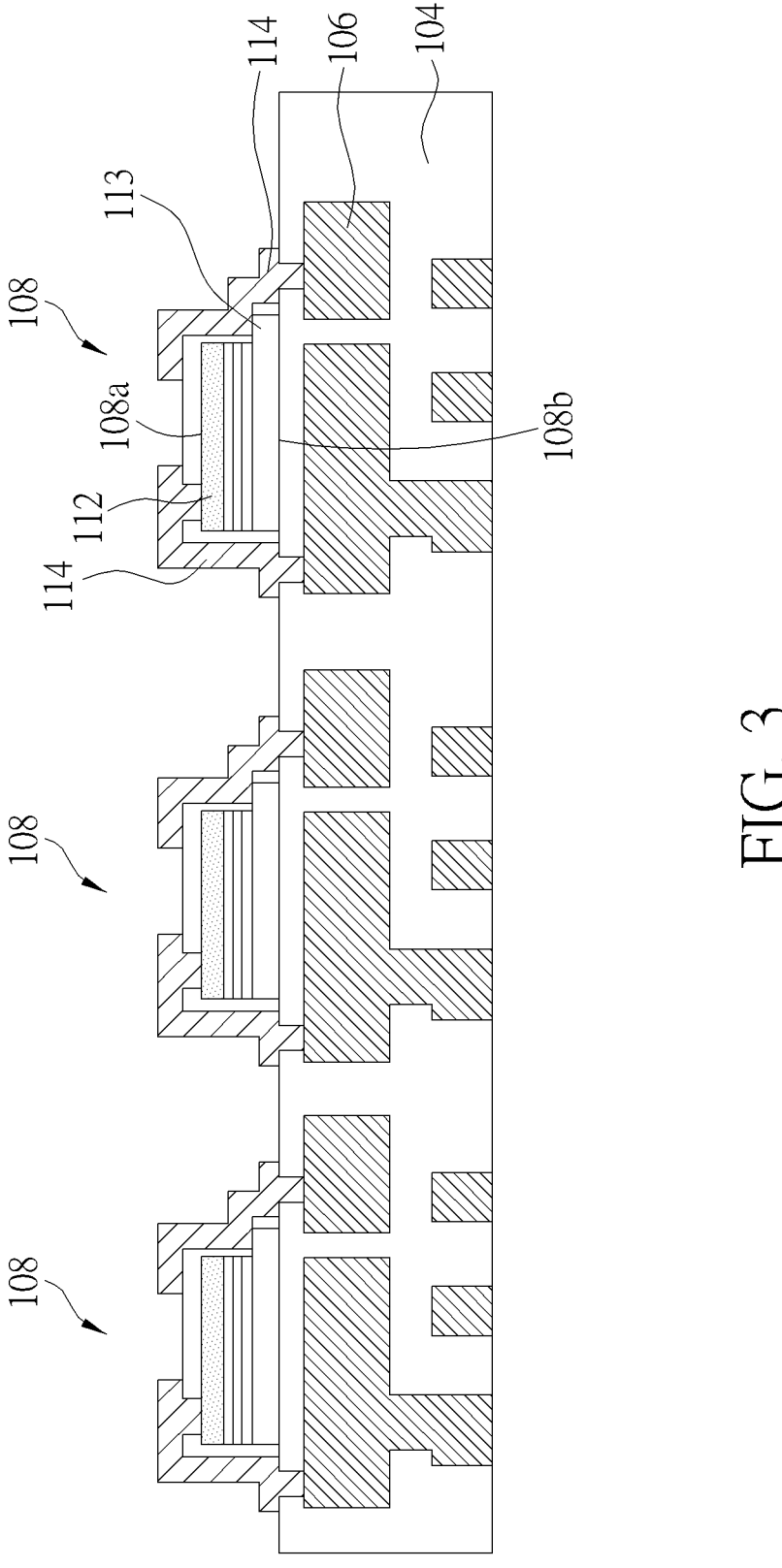
FIG. 3 is an enlarged cross-section of the LED structure in accordance with another embodiment of the present invention.

Please refer to FIG. 3, which is an enlarged cross-section of the LED structure in accordance with another embodiment of the present invention. The structure of this embodiment is similar to the one of FIG. 2, with the difference that the conductive line 114 in FIG. 3 is conformally formed on the dielectric layer 116 on the surface of LED die 108, rather than formed in the dielectric layer 110 that covers the LED dies 108. The conductive lines 114 are also connected with the anode 112 and cathode 113 on the front surface 108a of LED die 108.

Figure 4:
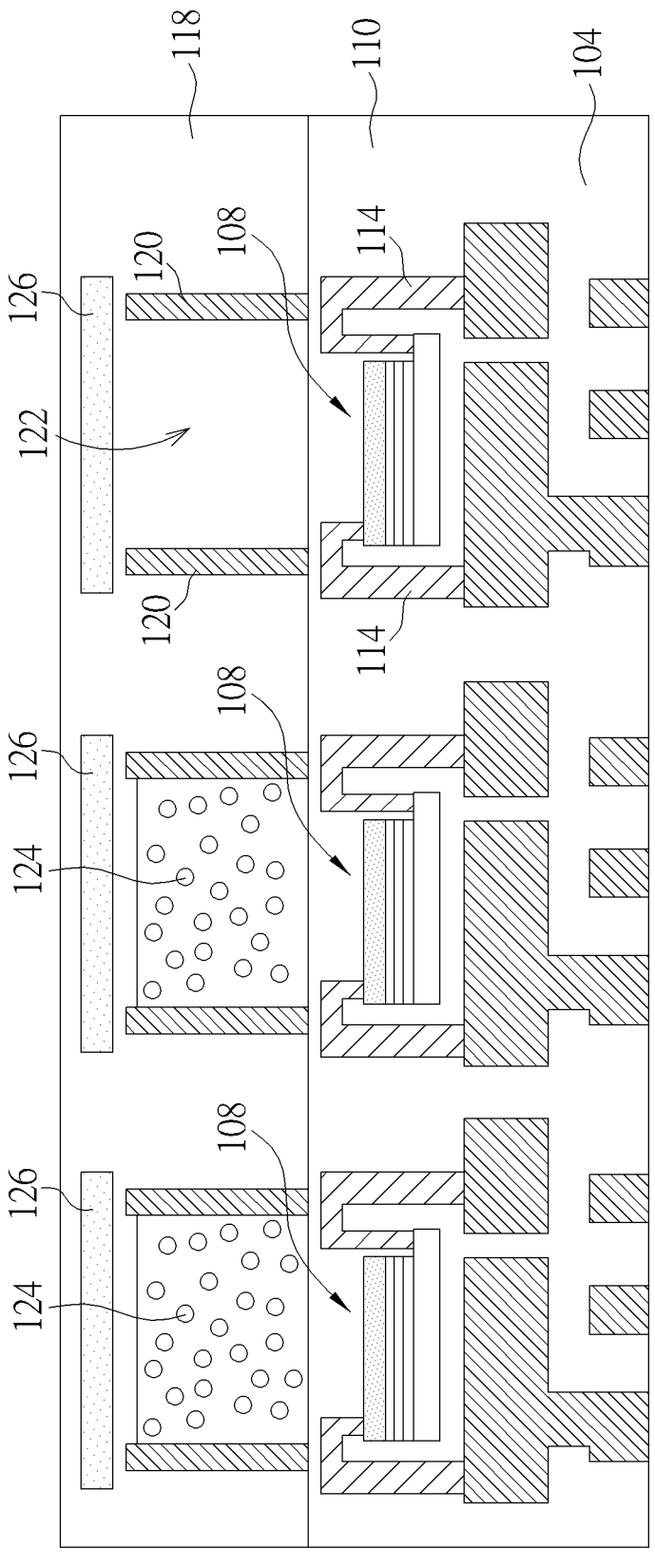
FIG. 4 is an enlarged cross-section of the LED structure including the quantum dot portions in accordance with one embodiment of the present invention.

Please refer to FIG. 4. The LED structure of present invention further includes a quantum dot portion 124 setting right above each LED die 108 to provide color image. In the embodiment of present invention, the quantum dot portion 124 is formed in a space 122 defined by metal grid 120, and another dielectric layer 118 is formed on the dielectric layer 110 to cover whole quantum dot portion 124. In this way, image light is first actively emitted by Micro LED array, and then be excited and color-rendered through quantum dot material, such as the quantum dot material of red (R), green (G) or blue (B, in the case using UV LED) to significant improve the NTSC gamut of rendered images and attain high color saturation and high contrast. In addition, an additional color filter 126 may be set above every quantum dot portion 124 to improve color purity of the image. Furthermore, in the embodiment of present invention, metal grid 120 around the quantum dot portions 124 would completely enclose entire quantum dot portions 124 of the LED structure, so that the light emitted from the quantum dot portions 124 will be totally reflected and will not be mixed with the light emitted from adjacent quantum dot portions 124, thereby further improving brightness and color purity of the image.

Figure 5:
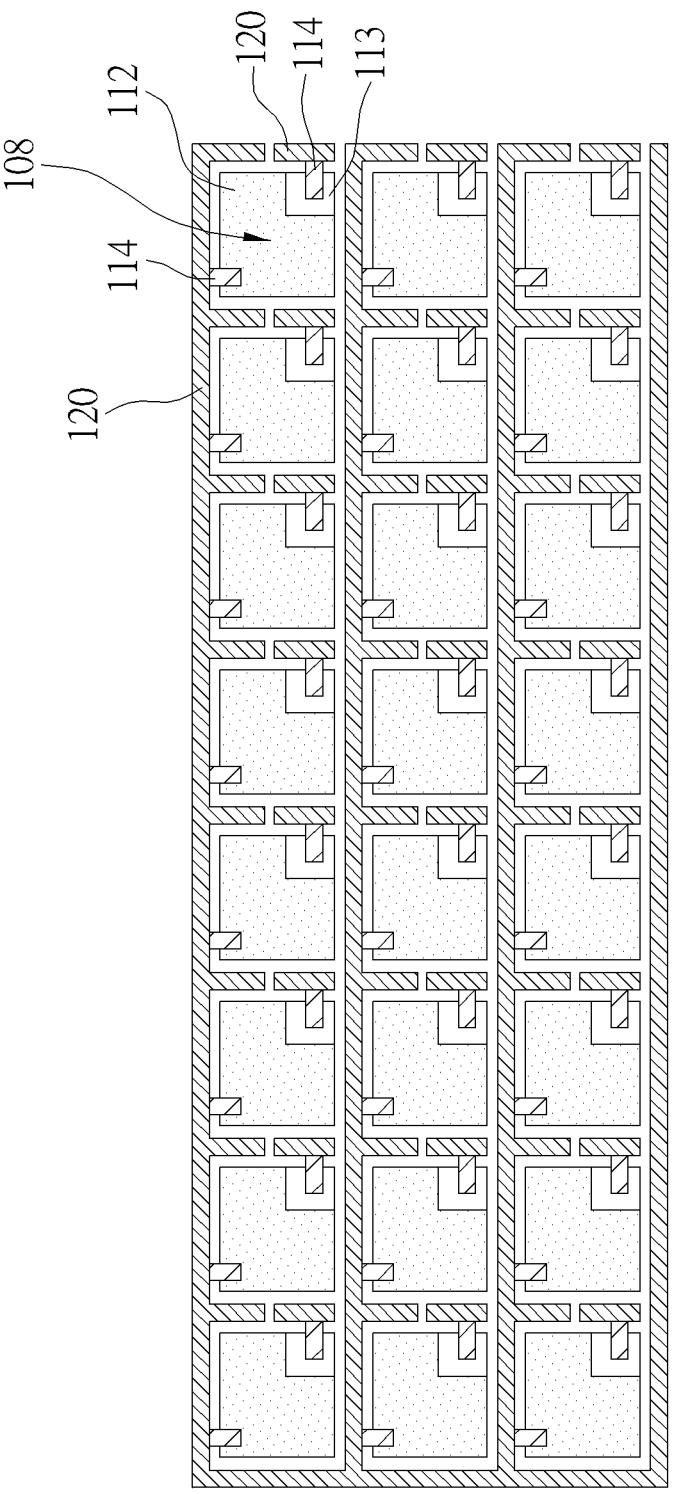
FIG. 5 is a schematic top view of a LED array in accordance with one embodiment of the present invention.

Please refer to FIG. 5, which is a schematic top view of a LED array in accordance with one embodiment of the present invention. The LED die 108 of present invention may be arranged on the substrate in a standard array. Each LED die 108 is neighbored by four adjacent LED dies 108 to provide compensation effect in soft repair action. The anode 112 and cathode 113 of LED die 108 are connected out through conductive lines 114 and may be common anode or common cathode. For example, the anode 112 of every LED die 108 in the figure is connected to a common anode and the anodes 113 are connected to respective driver circuits, so that the circuit design may be simplified in present invention. Furthermore, Every LED die 108 (including the quantum dot portion 124 above) is enclosed by surrounding metal grid 120, so that the light emitted by the LED pixel will not be mixed with the light emitted by adjacent pixels, to further improve brightness and color purity of the image and achieve the effect of device isolation.

Figure 6:
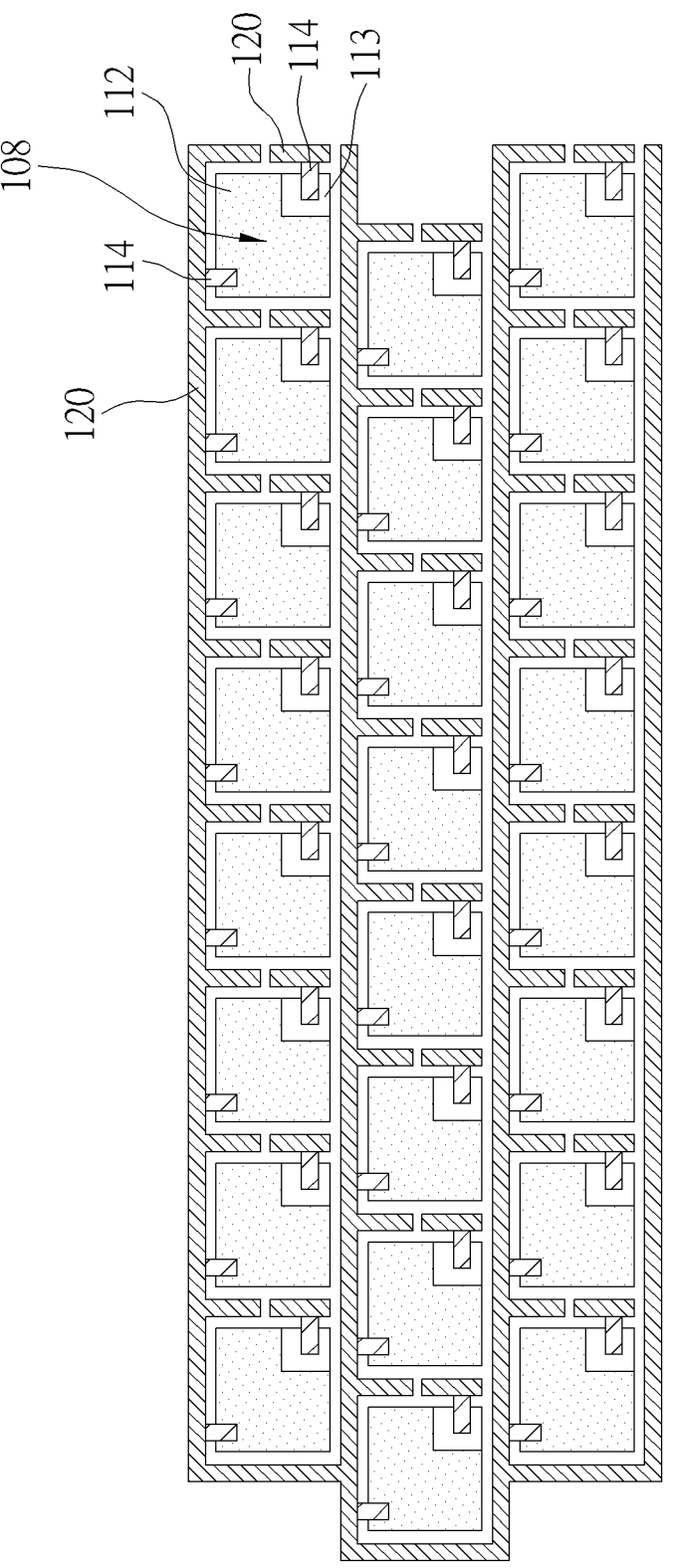
FIG. 6 is a schematic top view of a LED array in accordance with another embodiment of the present invention.

Please refer to FIG. 6, which is a schematic top view of a LED array in accordance with another embodiment of the present invention. LED dies 108 in this embodiment are set in a staggered arrangement, so that each LED die 108 is neighbored by six adjacent LED dies 108 to further improve the compensation effect in soft repair action.

Figure 7:
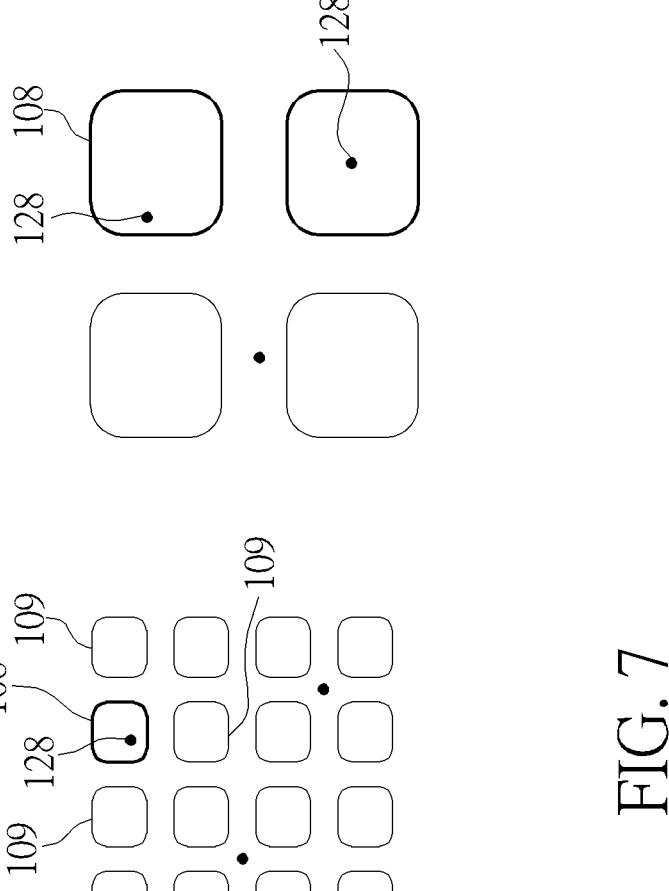
FIG. 7 is a schematic top view illustrating the soft repair actions for LED pixels in accordance with another embodiment of the present invention.
Figure 7:
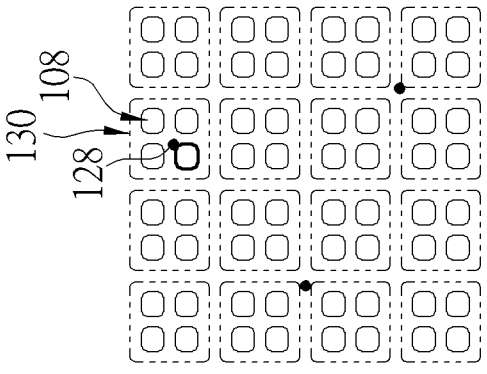

Please refer now to FIG. 7, which is a schematic top view illustrating the soft repair actions for LED pixels in accordance with one embodiment of the present invention. Regarding to the LED die 108 having larger size as shown in the right part of FIG. 7, one LED die 108 functions as a pixel, thus a defect 128 appears at the location of this LED die, this pixel may fail and remain on or off. As shown in the middle part of FIG. 7, if the size of LED die can be reduced to increase the resolution, one LED die may still function as a pixel unit. If one LED die 108 or pixel fails due to the defect 128 thereon, it can be compensated by adjacent LED dies 109 in soft repair action, and the defects 128 may also have higher probability not to appear at the location of LED die due to the smaller size. In the case that the LED die 108 has even smaller size and even higher resolution as shown in the left part of FIG. 7, four LED dies 108 may function as a pixel 130. In this way, even when one LED die 108 fails due to the defects 128 formed thereon, there are still three other redundant LED dies 108 in the pixel that may emit normally, without impacting display function.

In conventional skill using mass transfer approach, the size of transferred LED die is quite limited, LED dies with even smaller size can't be transferred precisely, the transfer speed is far from meeting the requirement of mass production, and the transfer yield can't also meet the business needs. Furthermore, mass transfer is always followed by hard repair approaches. That is, directly replacing defected LED dies with normal LED dies, which is an approach taking much time and effort. In comparison thereto, the present invention forms the LED dies directly on the substrate of driver circuit through mature semiconductor processes. This kind of approach not only prevent immature mass transfer step having the aforementioned disadvantages and capable of manufacturing LED dies compatible to the size (even smaller) of Micro LED specification, but also may repair defected dies using simple, practical soft repair method, which is an invention provided both with novelty and non-obviousness.

The process flow of manufacturing the LED structure of present invention will now be described in following embodiment.

Figure 8:
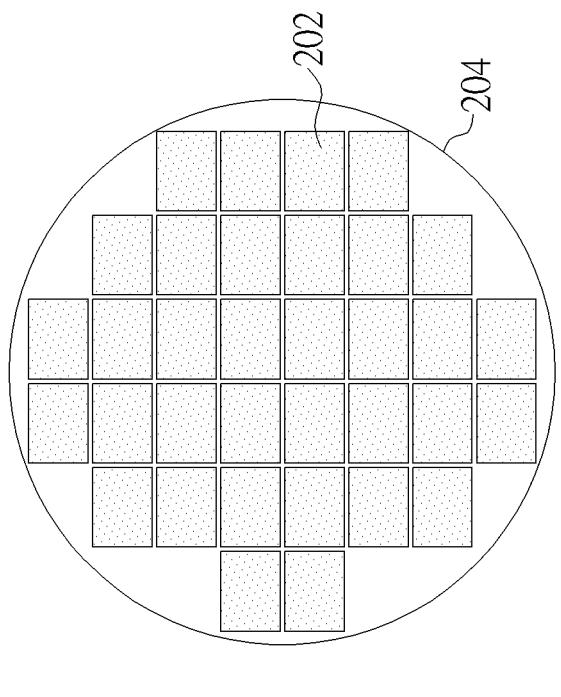
FIG. 8 is a schematic top view illustrating multiple small-size LED chips arranged on a large-size handle wafer in accordance with one embodiment of the present invention.
Figure 8:
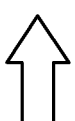
Figure 8:
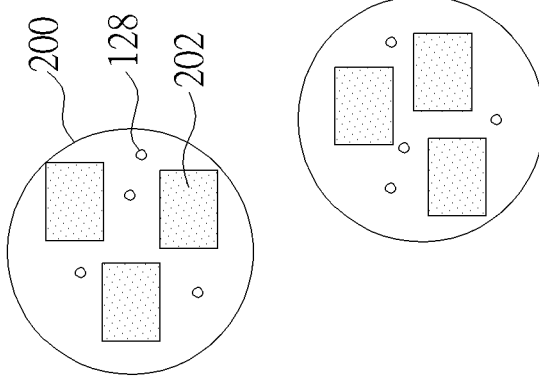
Figure 8:
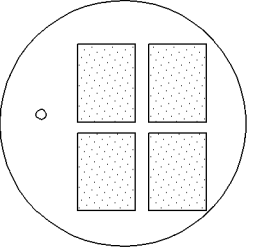

First, please refer to FIG. 8, which is a schematic top view illustrating multiple small-size LED epitaxial chips arranged on a large-size handle wafer in accordance with one embodiment of the present invention. In the beginning of step 1, the LED chips will be redistributed to reduce defects and increase their process area. As shown in the figure, currently, standard LED wafer is usually 4-inch or 6-inch in size, with various defects 128 existing thereon. This step will first inspect LED wafers 200 to find out the locations of defects 128 thereon. Next, parts of LED wafers 200 without having no defect will be cut into multiple LED chips 202 with specific size, so as to ensure these LED chips 202 free from defects 128 and work normally. Thereafter, the cut LED chips 202 are arranged in order on a larger handle wafer 204, such as a 8-inch or 12-inch silicon wafer, so as to provide a larger process area in later LED process. Other peripheral parts without the LED chips 202 may be filled with dummy LED chips or defected LED chips to improve process uniformity.

Figure 9:
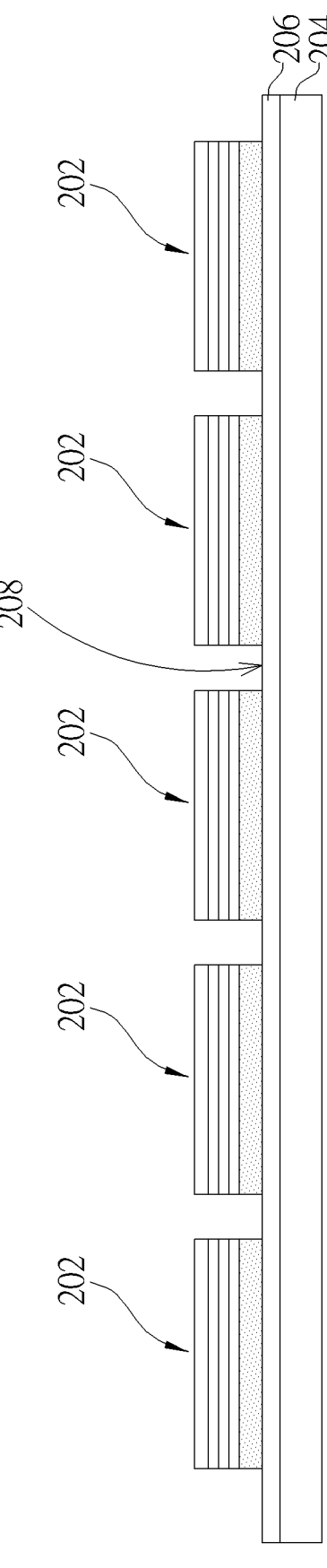
FIG. 9 to FIG. 10 are schematic cross-sections illustrating multiple small-size LED chips arranged on a large-size handle wafer in accordance with one embodiment of the present invention.

Please refer to FIG. 9, which is schematic cross-section illustrating those small-size LED chips arranged on a large-size handle wafer in accordance with one embodiment of the present invention. In the embodiment of present invention, the LED chips 202 are aligned with the scribe lines 208 and uniformly arranged on the handle wafer 204. The LED chip 202 may be temporarily bonded on the handle wafer 204 through bonding materials or by forming oxide layers for bonding, wherein the material of bonding layer may be wax, tape, polymer or silicon oxide, etc. The LED chips 202 and handle wafer 204 may be de-bonded through mechanical or laser methods in later process.

Figure 10:
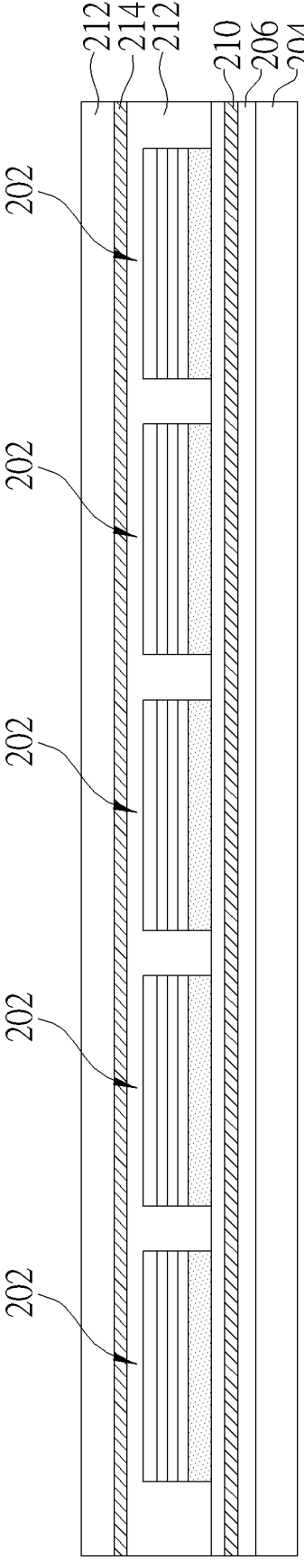

Please refer to FIG. 10. After the LED chips 202 are redistributed on the large-size handle wafer 204, another bonding layer 212 is then formed on the LED chips 202 and bonding layer 206 to cover those LED chips 202 and fill up the gaps therebetween. The material of bonding layer 212 may be silicon oxide. In some embodiments, additional stop layers 210, 214 may be formed respectively in the bonding layer 212 and the bonding layer 206 depending on process requirement. The material of stop layers 210, 214 may be silicon nitride, silicon carbon nitride or material different from the one of bonding layer 206.

Please refer now from FIG. 11 to FIG. 15, which are schematic cross-sections illustrating a process flow of manufacturing the LED structure in accordance with one embodiment of the present invention.

Figure 11:
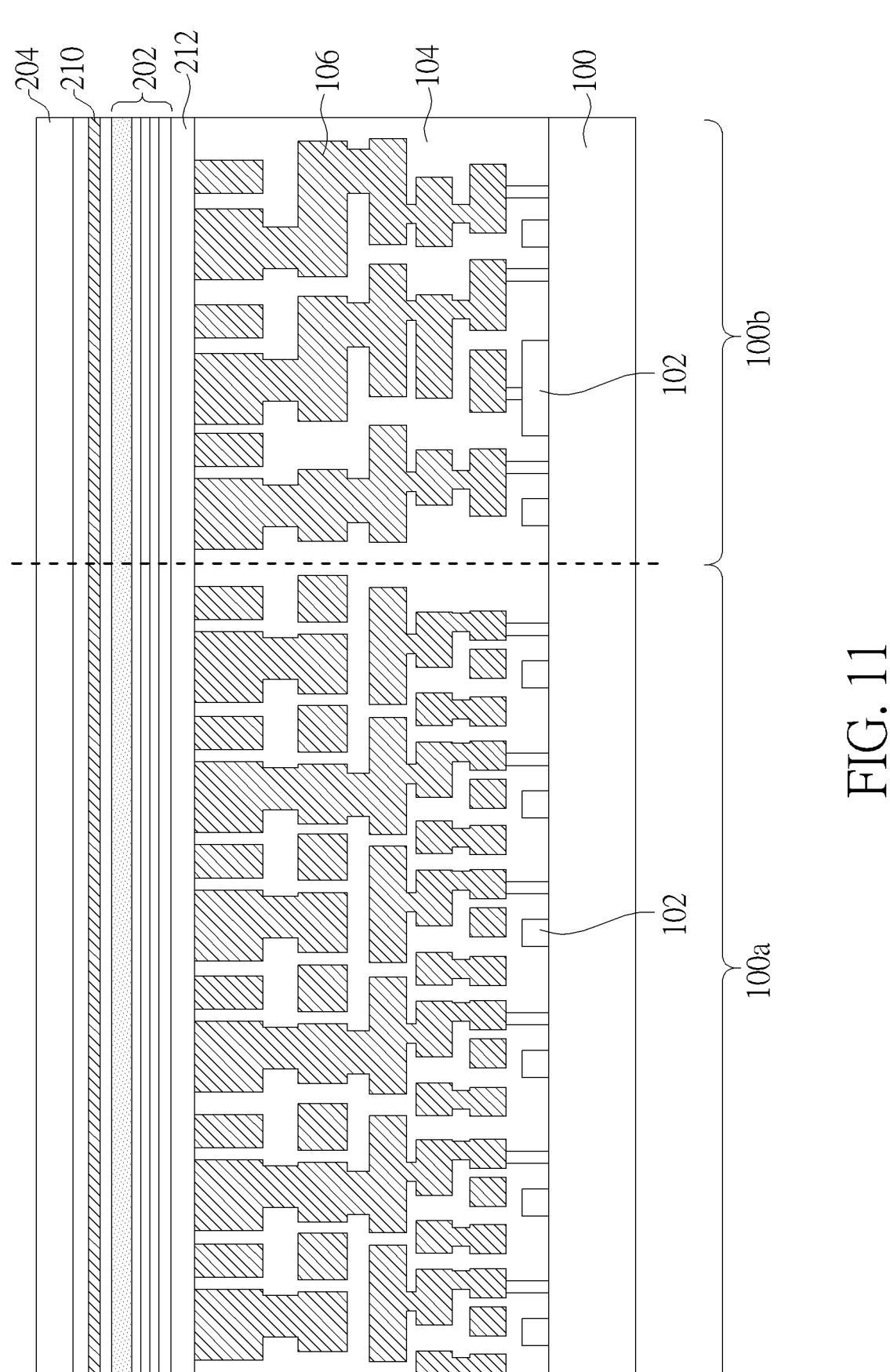
FIG. 11 to FIG. 15 are schematic cross-sections illustrating a process flow of manufacturing the LED structure in accordance with one embodiment of the present invention.

As shown in FIG. 11. After the LED wafer is prepared, the LED wafer will be then bonded to a wafer of driver circuit. In the embodiment of present invention, the wafer of driver circuit may include a substrate 100, such as a substrate made of semiconductor material suitable for CMOS process, wherein the semiconductor material may be selected from the group of silicon (Si), germanium (Ge), silicon germanium compound (SiGe), silicon carbide (SiC) and gallium arsenide (GaAs), etc. A memory region 100*a* and a logic region 100*b* are defined on the substrate 100, wherein devices 102 like static random access memory (SRAM) or Flash memory may be set in the memory region 100*a* on the substrate 100. Devices 103 like logic switch or LED driver may be set in the logic region 100*b* on the substrate. Metal interconnects 106 manufactured by conventional CMOS BEOL (back end of line) process are further provided on the substrate 100, which are in a dielectric layer 104 and electrically connected with the devices 102, 103 or the substrate 100 below through contacts. In the embodiment of present invention, the LED wafer is bonded on the dielectric layer 104 of circuit wafer with its side of bonding layer 212, which may be through the abutting of silicon oxide based bonding layers. The original handle wafer 204 and the substrate 100 are on the opposite sides of bonded wafer after the bonding process. Please note that the LED chip 202 shown in this figure is single chip, the region without LED chips 202 (ex. scribe line) will be filled up with the bonding layer 212.

Figure 12:
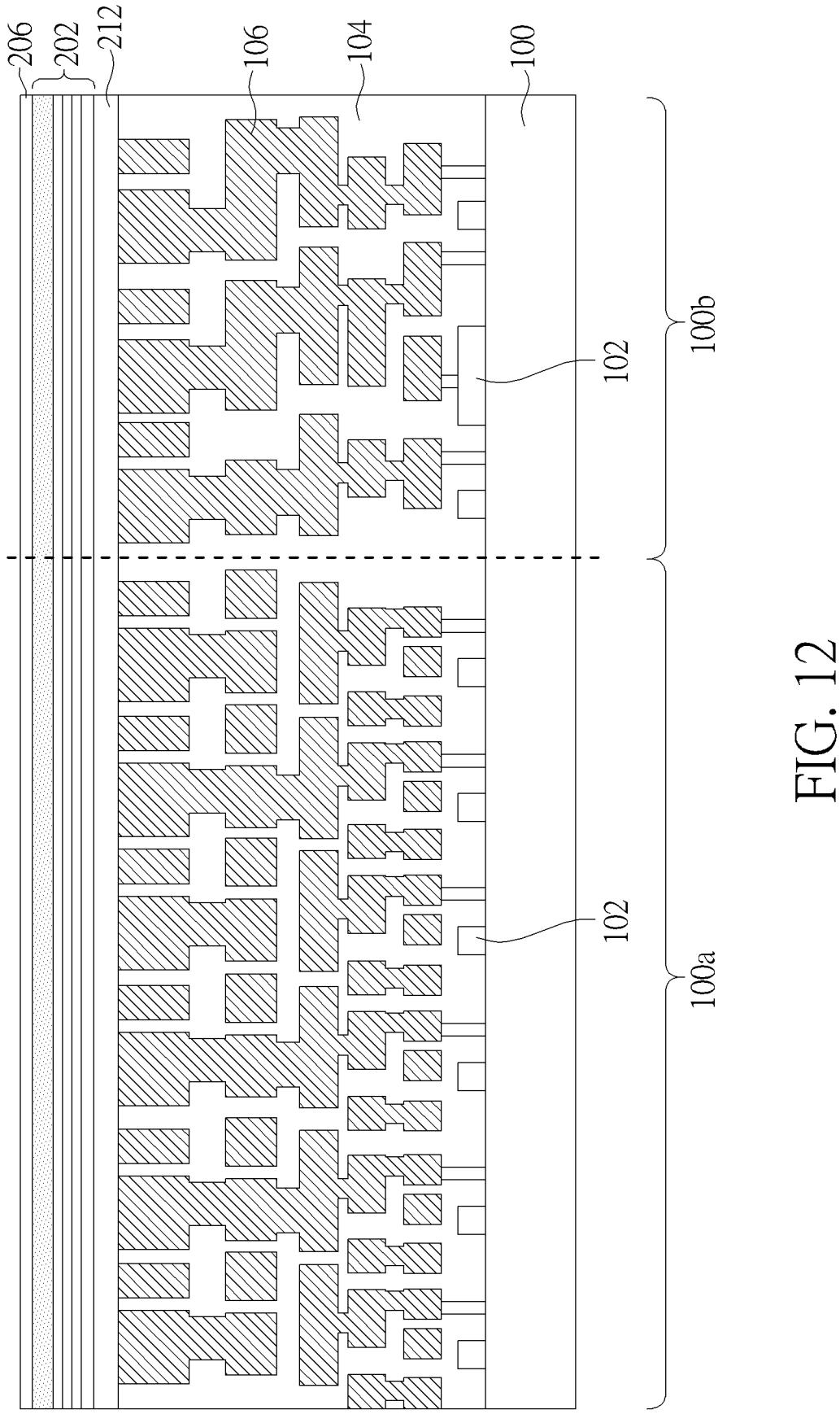

Please refer to FIG. 12. After the wafer is bonded, the handle wafer 204 on the LED chip 202 may be removed through direct mechanical detaching, laser detaching or by performing a CMP process using the stop layer 210 as a grinding stop layer. After the handle wafer 204 is removed, the LED chip 202 is preferably remained with parts of bonding layer 206 thereon or forming other dielectric layer to cover the LED chip 202.

Figure 13:
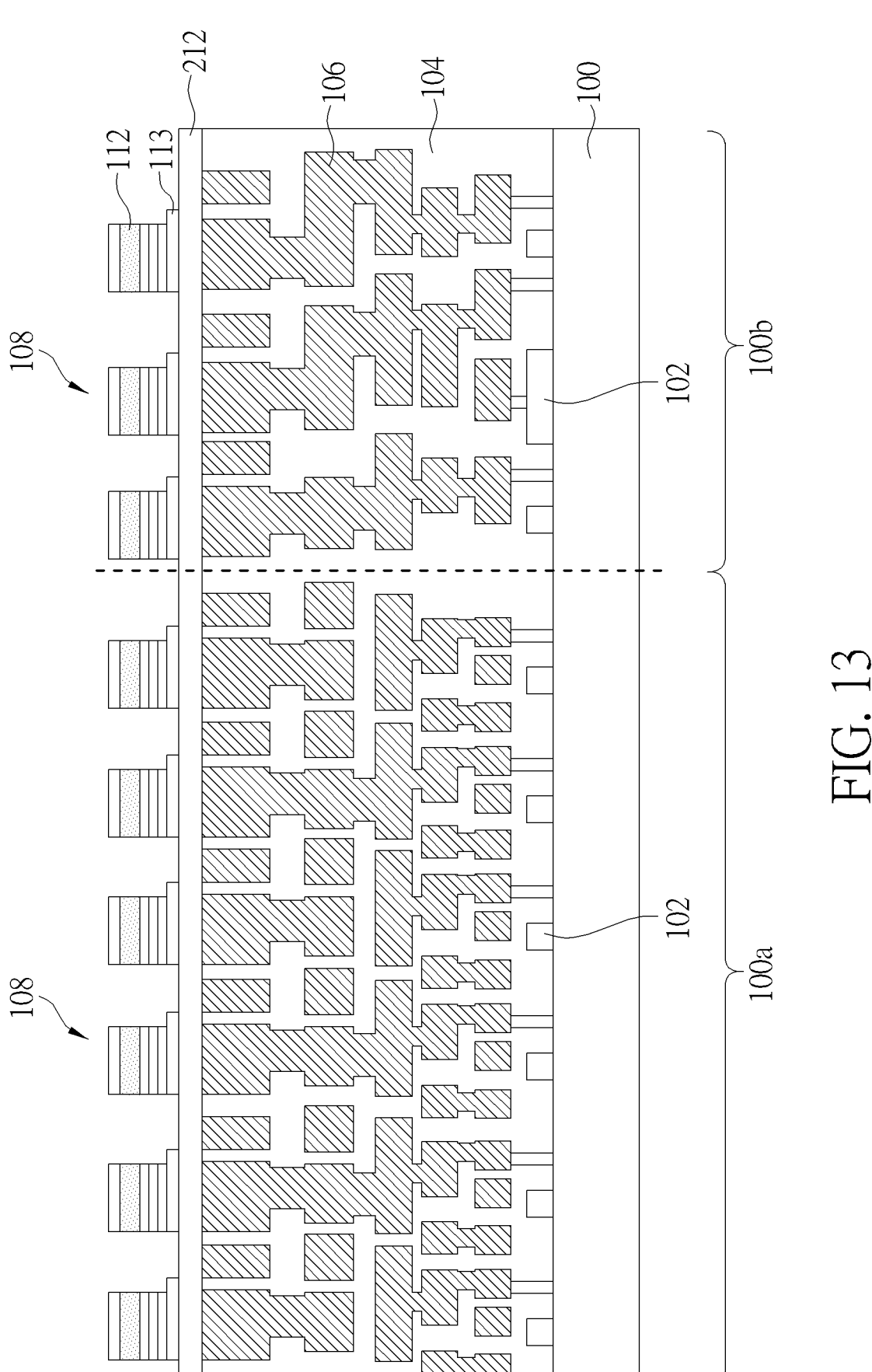

Please refer to FIG. 13. After the handle wafer 204 is removed, a photolithography process is then performed to pattern the LED chip 202 into individual LED dies 108. For example, the LED dies 108 may be formed through dual-damascene process or step process (may use the layer 214 in FIG. 10 as an etching stop layer). The cathode 113 at bottom of the die after patterning extends in the horizontal direction beyond the anode 112 at top of the die (the positions of anode 112 and cathode 113 may be exchanged) to provide contact areas. The patterned LED dies 108 are uniformly distributed on the substrate surface, and the LED dies 108 will not be formed on transparent regions. The size of LED die 108 formed in this photolithography process may be 0.5-10 μm, smaller than the size of dies (approximately 10-100 μm) that may be transferred in mass transfer process and meeting the requirement of advanced Micro LED display technology.

Figure 14:
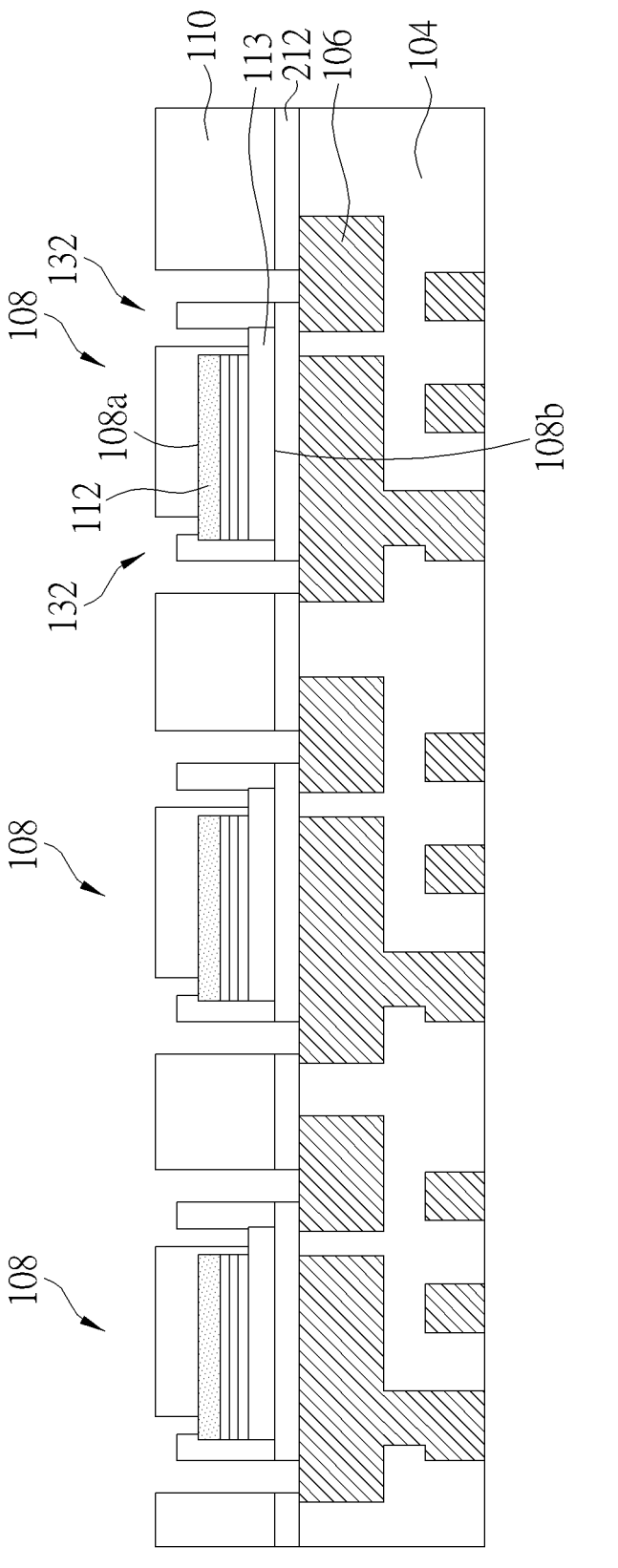

Please refer to FIG. 14. After individual LED dies 108 are formed, a dielectric layer 110 is formed on the LED chips 108 and bonding layer 110 or the dielectric layer 104 in order to cover the LED chips 108 and fill up the gaps therebetween. The material of dielectric layer 110 may be silicon oxide, ultra low-k (ULK) dielectric or tetraethoxysilane (TEOS), which may be formed through CVD or PECVD process. Next, a photolithography process is performed to form recesses of conductive line 132 in the dielectric layer 110, wherein the recess of conductive line 132 would expose the metal interconnects 106 and the contact areas of anode 112 and cathode 113 below.

Figure 15:
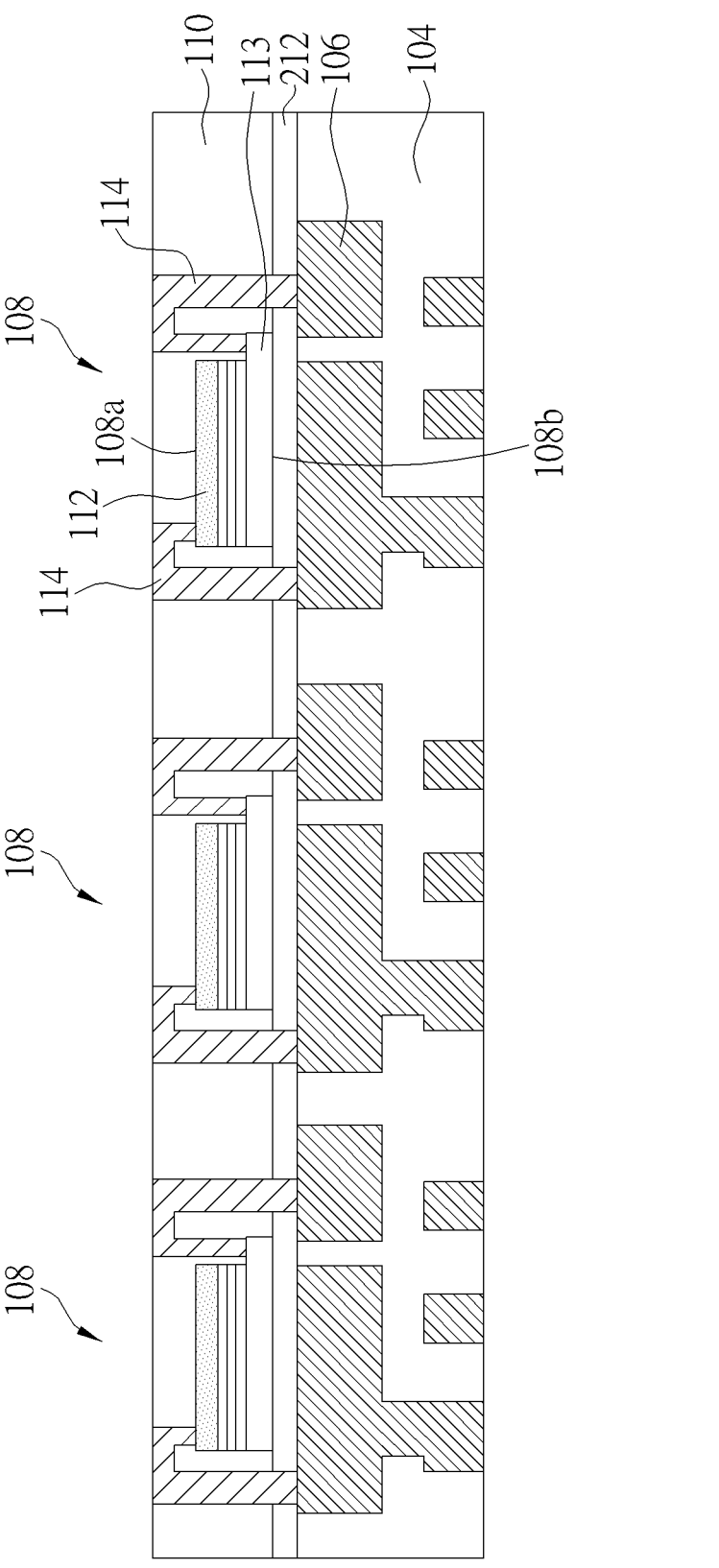

Please refer to FIG. 15. After the recesses of conductive line 132 are formed, the recesses of conductive line 132 are filled with conductive materials to form conductive lines 114, so that the individual LED dies 108 may be electrically connected with the driver circuit below and be controlled and activated by the driver circuit. The material of conductive line 114 may be tungsten (W), copper (Cu), aluminum (Al), silver (Ag), gold (Au), nickel (Ni), titanium (Ti) or indium tin oxide (ITO), etc., or multilayer structure formed thereof, which may be formed through CVD, PVD or electroplating method cooperating with CMP process.

Figure 16:
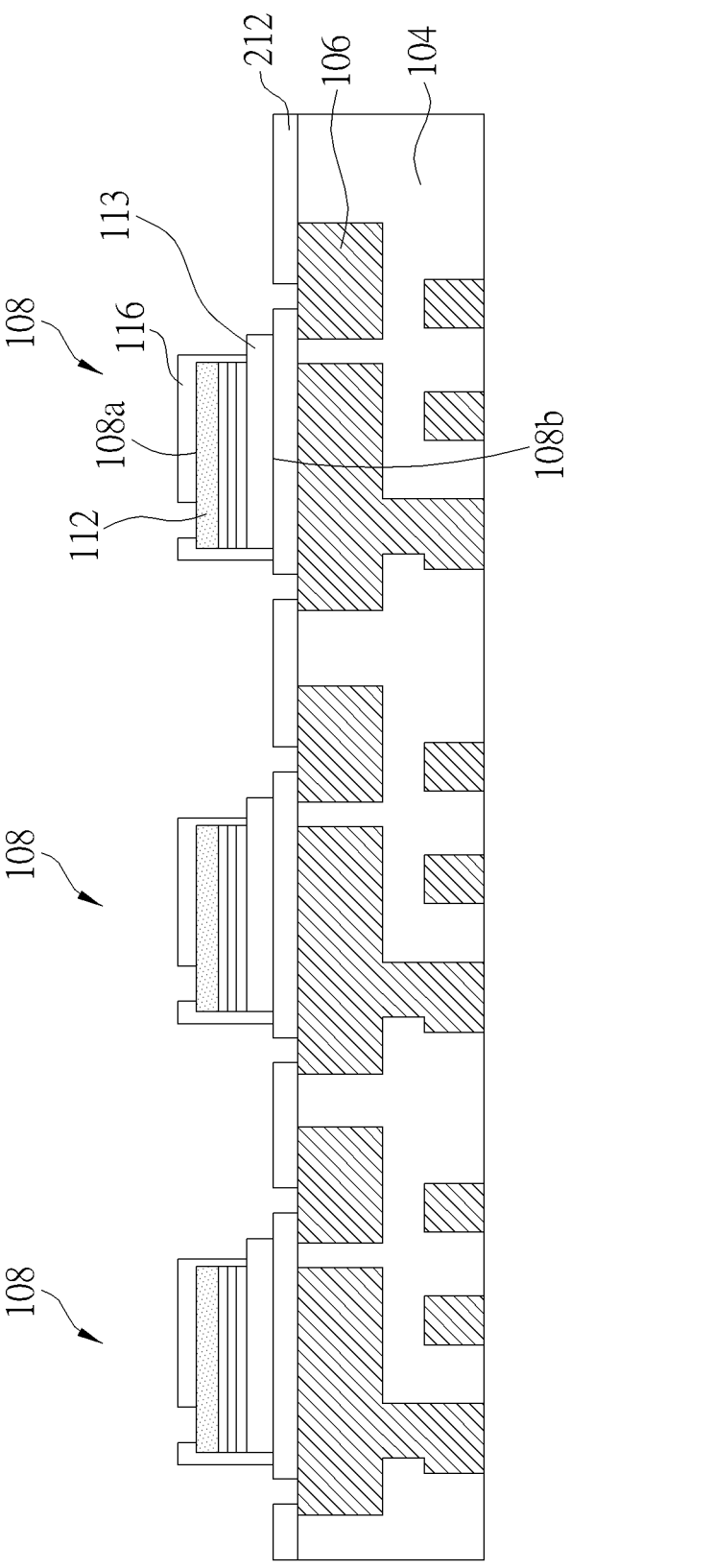
FIG. 16 to FIG. 17 are schematic cross-sections illustrating a process flow of manufacturing the LED structure in accordance with another embodiment of the present invention.
Figure 17:
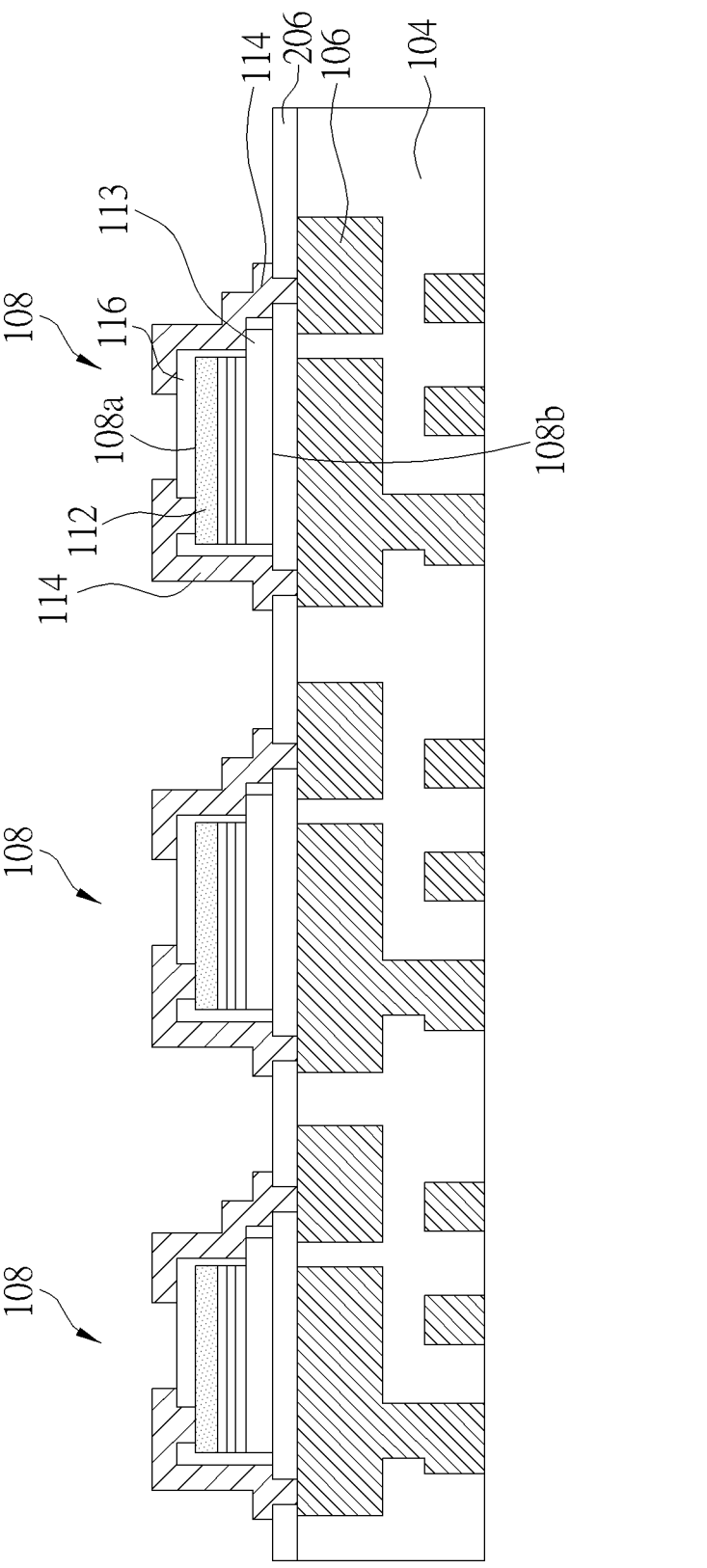

In addition to the embodiments above, the conductive lines of present invention may be manufactured through other methods. As shown in FIG. 16, a thin dielectric layer 116 may be first formed on the surface OF LED chip 108, and openings 134 are then formed in the dielectric layer 116, bonding layer 212 and/or dielectric layer 104 to expose contact areas on the anode 112 and cathode 113 of the LED chip 108. Thereafter, as shown in FIG. 17, a conformal conductive layer is formed on the surfaces of dielectric layer 116, bonding layer 212 and/or dielectric layer 104, and the photolithography process is performed again to pattern the conductive layer, so as to form the conductive lines 114 connecting the anode 112 and cathode 113 of LED chip 108 with the metal interconnects 106 below.

According to the description of embodiment above, the approach of forming LED dies and conductive lines directly on a substrate of driver circuit through mature semiconductor patterning process not only prevent immature mass transfer step having the aforementioned disadvantages and capable of manufacturing smaller LED dies, but also may repair defected dies using simple, practical soft repair method. Furthermore, the LED epitaxial wafer used in the process may be redistributed in advance to inspect and pick defect-free parts of LED wafer with uniform performance, which is an invention provided both with novelty and non-obviousness.

Those skilled in the art will readily observe that numerous, modifications and alterations of the device and method may be made while retaining the teachings of the invention. Accordingly, the above disclosure should be construed as limited only by the metes and bounds of the appended claims.

What is claimed is:

1. A light-emitting diode (LED) structure, comprising:
a substrate;
a first dielectric layer on said substrate;
metal interconnects in said first dielectric layer;
multiple LED dies, wherein each said LED die is provided with a front surface and a back surface, and a cathode and an anode of each said LED die are on said front surface, and said anode and said cathode are respectively in a top layer and a bottom layer of said LED die, said back surface is a surface of said bottom layer bonded on said first dielectric layer, and said cathode extends in a horizontal direction parallel to said front surface beyond said anode to form a contact area;
a second dielectric layer on said front surface and sidewalls of said LED dies; and
conductive lines connecting said cathode and said anode of said LED die respectively to said metal interconnects, and one of said conductive lines is electrically connected to said cathode through said contact area, wherein said conductive lines are conformally formed on said second dielectric layer.

2. The light-emitting diode (LED) structure of claim 1, further comprising a quantum dot right on each said LED die, wherein each said quantum dot portion is surrounded by a metal grid.

3. The light-emitting diode (LED) structure of claim 1, wherein a third dielectric layer is surrounded said LED dies on said first dielectric layer and fills up spaces between said LED dies, and said conductive lines are formed in said third dielectric layer.

4. The light-emitting diode (LED) structure of claim 1, further comprising a bonding layer between said first dielectric layer and said LED dies.

5. The light-emitting diode (LED) structure of claim 1, wherein said LED dies are arranged on said substrate in a standard array or in a staggered array.

6. The light-emitting diode (LED) structure of claim 1, wherein a memory region and a logic region are defined on said substrate, and said LED structure further comprises static random access memory (SRAM) and Flash memory on said memory region of said substrate and LED drivers on said logic region.

7. The light-emitting diode (LED) structure of claim 1, wherein said LED die is Micro LED die.

* * * * *